United States Patent
Wachtler

(10) Patent No.: US 7,928,550 B2
(45) Date of Patent: Apr. 19, 2011

(54) FLEXIBLE INTERPOSER FOR STACKING SEMICONDUCTOR CHIPS AND CONNECTING SAME TO SUBSTRATE

(75) Inventor: Kurt Peter Wachtler, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 349 days.

(21) Appl. No.: 11/936,938

(22) Filed: Nov. 8, 2007

(65) Prior Publication Data

US 2009/0121346 A1    May 14, 2009

(51) Int. Cl.
   *H01L 23/02*   (2006.01)
(52) U.S. Cl. .................. 257/686; 257/E23.171
(58) Field of Classification Search .............. 257/778, 257/686, 777, 169, 171–174, E23.151, E23.169, 257/E23.171–E23.174
   See application file for complete search history.

(56) References Cited

U.S. PATENT DOCUMENTS

| | | | |
|---|---|---|---|
| 5,438,224 A * | 8/1995 | Papageorge et al. | 257/777 |
| 6,117,723 A * | 9/2000 | Huang | 438/238 |
| 7,144,538 B2 * | 12/2006 | Lee et al. | 264/272.11 |
| 7,217,998 B2 * | 5/2007 | Tamagawa et al. | 257/707 |
| 7,317,243 B2 * | 1/2008 | Wang | 257/668 |
| 7,443,030 B2 * | 10/2008 | Muthukumar et al. | 257/758 |
| 7,501,696 B2 * | 3/2009 | Koyama et al. | 257/686 |
| 7,535,090 B2 * | 5/2009 | Furuyama et al. | 257/686 |
| 2007/0196953 A1 * | 8/2007 | Fasano et al. | 438/108 |
| 2007/0235850 A1 * | 10/2007 | Gerber et al. | 257/678 |
| 2008/0029884 A1 * | 2/2008 | Grafe et al. | 257/723 |
| 2008/0048309 A1 * | 2/2008 | Corisis et al. | 257/686 |

FOREIGN PATENT DOCUMENTS

JP    406283629  *  4/1993

* cited by examiner

*Primary Examiner* — Matthew W Such
*Assistant Examiner* — Ali Naraghi
(74) *Attorney, Agent, or Firm* — Yingsheng Tung; Wade J. Brady, III; Frederick J. Telecky, Jr.

(57) ABSTRACT

A semiconductor device with a first (101) and a second (111) semiconductor chip assembled on an insulating flexible interposer (120). The interposer, preferably about 25 to 50 μm thick, has conductive traces (121), a central planar rectangular area and on each side of the rectangle a wing bent at an angle from the central plane. The central area has metal studs (122, 123) on the top and the bottom surface, which match the terminals of the chips, further conductive vias of a pitch center-to-center about 50 μm or less. The side wings have contact pads (130) with metallic connectors (131) on the bottom surface; the connectors may be solder balls, metal studs, or anisotropic conductive films. The second chip is adhesively attached to a substrate, whereby the interposer faces away from the substrate. The interposer side wings have a convex bending (150) downwardly along the second chip and a concave bending (151) over the substrate; the side wing connectors are attached to the matching substrate sites.

12 Claims, 3 Drawing Sheets

FLEXIBLE INTERPOSER FOR STACKING SEMICONDUCTOR CHIPS AND CONNECTING SAME TO SUBSTRATE

FIELD OF THE INVENTION

The present invention is related in general to the field of semiconductor devices and processes, and more specifically to low profile devices having a flexible interposer to integrate the chips vertically and to connect them to a substrate.

DESCRIPTION OF RELATED ART

Driven by the desire to reduce the board area needed to assemble a semiconductor device into electronic products such as hand-held telephones, today's semiconductor devices often use vertically stacked chips inside the packages. These chip stacks frequently include chips of significantly different sizes, assembled mostly by wire bonding techniques on interposers commonly made of rigid materials such as ceramics or fiber-enforced plastics such as FR-4 and others.

After stacking the chips, the methodology to establish electrical connections from the stack to the substrate of the device or directly to the printed circuit board is most commonly a high-aspect ratio (height-to-width) metal post formed in some manner. The posts may consist of gold, copper, or an elongated solder column. They are difficult to form, expensive and have a high failure rate by cracks in the contact joints caused in temperature cycle testing and high temperature operation. In addition, the high-aspect ratio posts offer only a limited number of connections per unit area on the target surface.

SUMMARY OF THE INVENTION

Applicant recognizes the need for a paradigm shift in chip assembly in order to accomplish simultaneously the benefit for a significantly higher number of inputs/outputs, for freedom of choosing chips of different sizes and rerouting needs, for higher reliability based on reduced stress on the contact joints and on low-k dielectrics in the chips, and on reduced package warpage, and for reduced package thickness due to avoidance of wire bonding. Applicant found in his investigations that additional advantages can be gained, such as opportunities to build-in thin film passive structures, to back-grind chips, and to reduce assembly costs, when flexible insulating interposers, integral with conductive vias and traces, are employed to stack the semiconductor chips and connect them to the substrate.

One embodiment of the invention is a semiconductor device with a first and a second semiconductor chip assembled on an insulating flexible interposer, preferably by fused micro-studs. The interposer, preferably polyimide-based and about 25 to 50 µm thick, has conductive traces, a central planar rectangular area and on each side of the rectangle a wing bent at an angle from the central plane. The central area has metal studs (preferably gold or copper) on the top and the bottom surface, which match the terminals of the chips; furthermore, the central area has conductive vias of a pitch center-to-center about 50 µm or less extending from the top to the bottom chip surface. The at least one side wing of the interposer has contact pads with metallic connectors on the bottom surface; the connectors may be solder balls, metal studs, or anisotropic conductive films. The chips are flip-assembled on the respective interposer surfaces. The second chip is adhesively attached to a substrate, whereby the interposer faces away from the substrate. The interposer side wing, or wings, have a convex bending downwardly along the second chip and a concave bending over the substrate; the side wing connectors are attached to the matching substrate sites.

Discrete electronic components may be assembled on the interposer, and thin-film structures such as capacitors, inductors, antennas, and high-frequency-shields may be built inside the interposer. The substrate may have solder balls attached for connection to external parts.

Another embodiment of the invention is a method for fabricating a semiconductor device having a stacked first and second chip with terminals on their active surfaces. The stacking is facilitated by an insulating flexible interposer with conductive traces. For most devices, the interposer has a rectangular shape, wherein slits are extending diagonally inward from the corners of the rectangle. The ends of these slits define a boundary between a central area of the interposer and the peripheral regions on each side of the central area. The central area has metal studs on both surfaces matching the locations of the chip terminals, and conductive vias extending between the surfaces. The side regions have contact pads with metallic connectors.

In the process flow, the first chip terminals are flip-assembled on the central area of the top interposer surface, and the second chip terminals are flip-assembled on the central area of the bottom interposer surface. The second chip is then mounted on an insulating substrate whereby the interposer, attached to the chip terminals, faces away the away from the substrate. The substrate has metallic attachment sites. Next, the interposer side regions are bent convex downwardly along the second chip height and then concave horizontally over the substrate. The contact pads of the interposer side regions are then aligned with, and connected to, matching attachment sites on the substrate. For the connection, gold studs, copper studs, solder balls, or anisotropic conductive films may be used.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
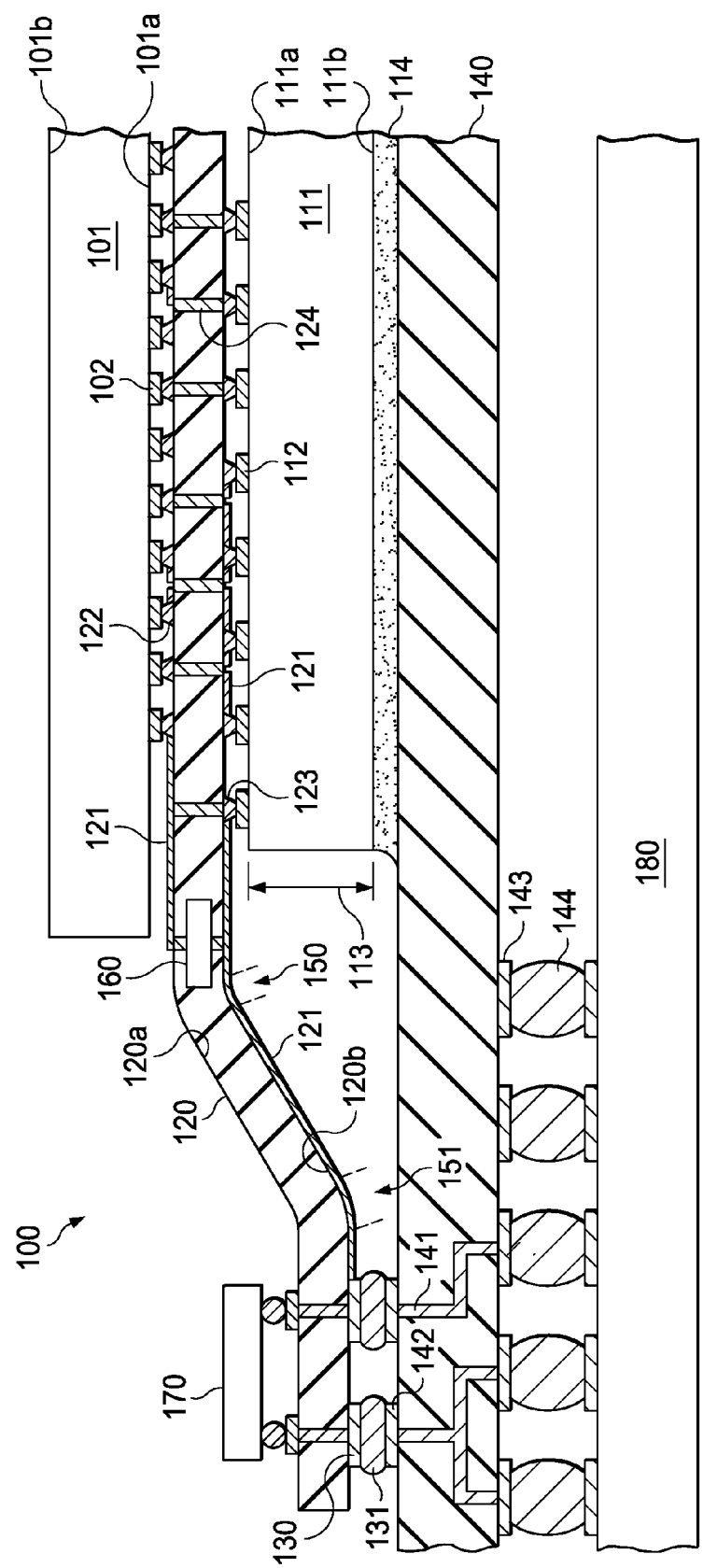
FIG. 1 illustrates a schematic cross section of an embodiment of the invention, a portion of a semiconductor device with a compliant interposer connected by convex and concave bending to a substrate, wherein the interposer has flipped chips with high pin count stacked on its surfaces; the interposer further has metal-filled vias and thin-film structures built inside the interposer.

An embodiment of the invention is illustrated by the portion of a semiconductor device, generally designated 100, depicted in FIG. 1. Device 100 has a first semiconductor chip 101 and a second semiconductor chip 111. Chip 101 has a surface 101a with transistors or other integrated circuit components, and with terminals 102 in first locations; further, chip 101 has a surface 101b without transistors. For brevity, a surface with transistors is called herein an "active" surface, and a surface without transistors a "passive" surface. Both surfaces may, however, include metallic redistribution traces and pads for electrical connections. Chip 111 has a surface 111a with transistors or other integrated circuit components ("active" surface 111a), and with terminals 112 in second locations; further, chip 101 has a surface 111b without transistors ("passive" surface 111b), and a height or thickness 113.

It should be pointed out that in some embodiments, it may be advantageous for chips 101 or 111 to have insulated yet metal-filled vias through the semiconductor material (not shown in FIG. 1). These vias may serve as electrically direct supply lines for power and ground, or as direct thermal paths for heat dissipation.

It should also be pointed out that in some embodiments, first chip 101 is a stack of chips. In other embodiments, second chip 111 is a stack of chips. In yet other embodiments, both the first chip and the second chip are stacks of chips.

Device 100 further has an insulating flexible interposer 120 with top surface 120a and bottom surface 120b. In some embodiments, the interposer may be compliant, in others relatively stiff. The interposer is preferably made of a low modulus (ratio stress/strain) polymer compound such as polyimide, and has a preferred thickness in the range from about 25 to 50 µm. This small thickness enables thin device packages. Interposer 120 may include conductive traces 121 both on its surfaces and in its interior. In FIG. 1, examples of traces 121 are illustrated at several locations. The ability of rerouting offers a welcome degree of freedom in laying out the interconnection plan for the device.

Figure 2:
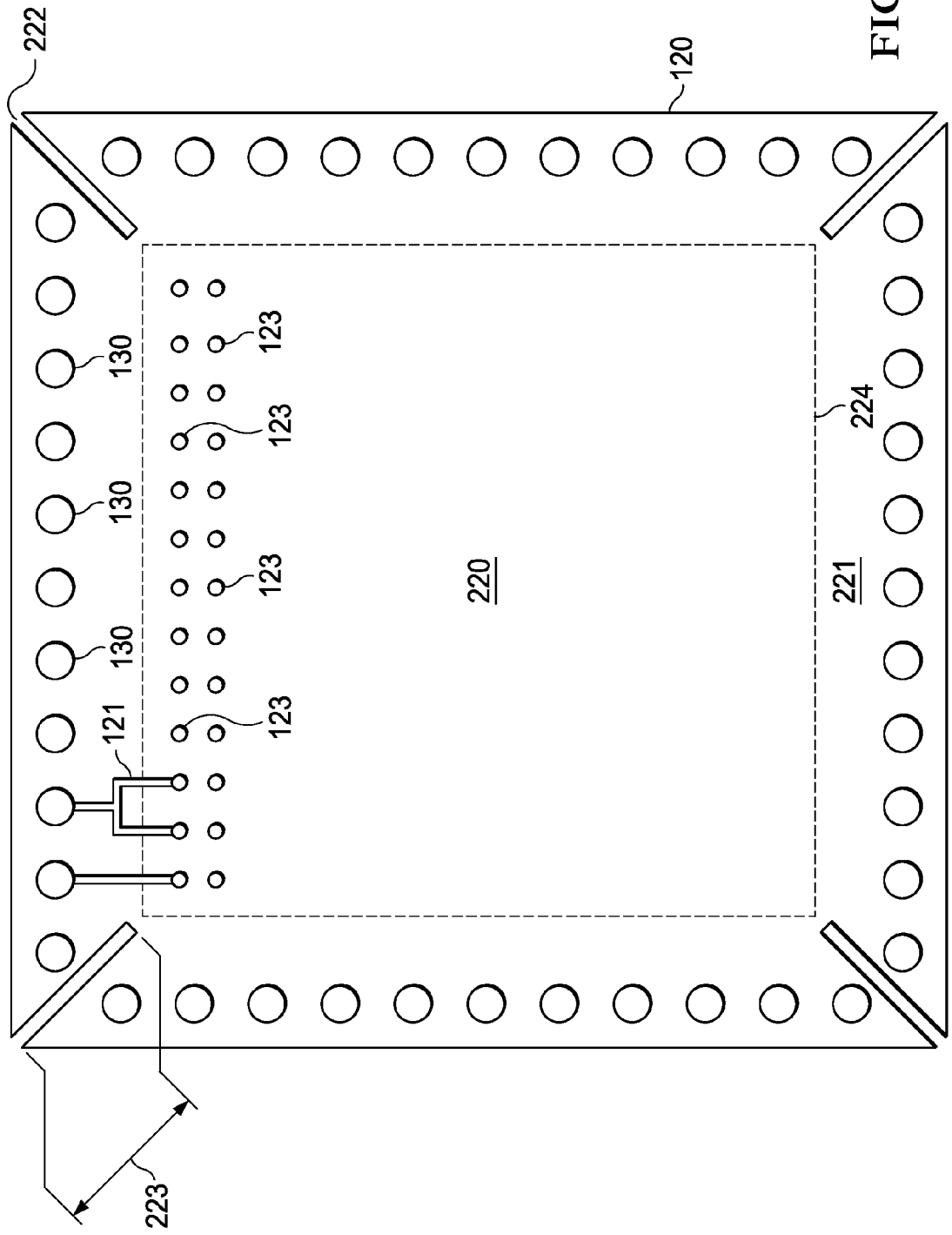
FIG. 2 is a schematic bottom view of the interposer before assembly, showing the rectangular shape, the slits from the corners diagonally inward, the metal studs in the central area, and the metallic connectors in the side regions.

Referring to FIG. 2, a view of the bottom surface 120b of the interposer before device assembly (see below) shows that interposer 120 has a sheet-like planar configuration and an overall rectangular shape with four corners. In some embodiments, interposer 120 has a square shape with four equally long sides. As FIG. 2 illustrates, interposer 120 has slits 222 extending from the corners of the rectangle diagonally inward for equal lengths 223. The endpoints of the slits define a central area 220 of the interposer, outlined in FIG. 2 by dashed lines 224 as the sides of the area. Slits 222 distinguish the central area 220 from the (four) peripheral wings 221, one wing on each side of the central area.

Referring now to FIG. 1, the central area is shown to have metal studs on the interposer surfaces. Preferred metals are gold or copper. Top surface 120a has metal studs 122 and bottom surface 120b has metal studs 123. Studs 122 match the locations of the first terminals 102 of chip 101. Studs 123 match the locations of the second terminals 112 of chip 111. The interposer thus removes any relationship restrictions, which the chip size may have imposed on the chip set. Studs 123 are also shown in FIG. 2 (bottom view of the interposer).

Figure 3:
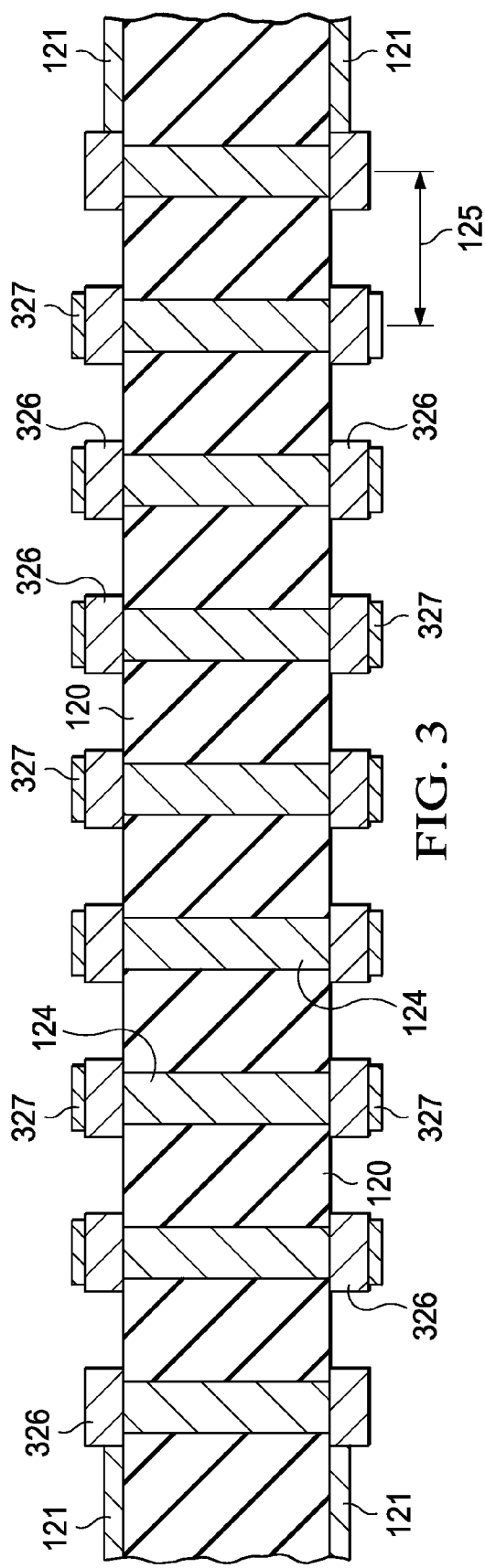
FIG. 3 is a schematic cross section of a portion of the interposer showing plated micro-vias through the dielectric material; micro-bumps with interconnect surface finish; and rerouting traces.

FIG. 1 illustrates conductive vias 124 extending from the top surface 120a to the bottom surface 120b in the central area of the interposer. More detail of the vias 124 in a portion of the interposer 120 is schematically shown in FIG. 3. In this portion, the vias are regularly spaced at a pitch 125 center-to-center; this regularity is advantageous for interposers, which are prepared based on a standardized via distribution. In other embodiments, the vias are less regularly spaced, or have a customized distribution. Vias 124 are filled with metal such as copper, preferably created by a plating technique.

As shown in FIG. 3, via pitch 125 is small, preferably less than 50 µm, more preferably less than 25 µm. Vias 124 are, therefore, sometimes referred to as micro-vias. At these fine pitches, very high pin count interconnections become feasible between the chip stack and the substrate, an advantage for leading-edge microprocessor and wireless products.

At the interposer surfaces, the via metal terminates in micro-bumps 326 (see FIG. 3), which may have a surface finish 327 (such as a flash of gold) in order to facilitate interconnection by thermo-compression, metal-interdiffusion, or soldering techniques. In many embodiments, micro-bumps 326 are identical with metal studs 122 or 123, in other embodiments micro-bumps 326 need to be connected to metal studs 122 or 123 by redistribution traces 121.

As FIG. 2 shows, side wings 221 have contact pads 130 on the bottom surface 120b (see FIG. 1) of the interposer. Pads 120 are in third locations and are preferably made of copper. Pads 130 provide contacts to metallic connectors 131, which may be selected from a group including gold, copper, alloys thereof, solder, solder-clad gold or copper, and anisotropic conductive film. Dependent on the type of metallic connector selected, the surface of pads 130 is prepared to facilitate the metallurgical connection; examples include a gold layer (flash) on copper, or layers of nickel and palladium on copper.

FIG. 1 illustrates the advantage of positioning a thin-film structure 160 inside the interposer, electrically connected to the conductive traces. Such structures may include capacitors, inductors, antennas, and shields against radio frequency. In addition, FIG. 1 indicates the possibility of assembling discrete electronic components 170 on the surface of the interposer; examples are capacitors, resistors, and even individual active devices.

As depicted in FIG. 1, device 100 further includes an insulating substrate 140 integral with conductive traces and vias 141 and attachment sites on both surfaces. The sites designated 142 match the third locations of the pads of the interposer side wings. The sites 143 on the opposite substrate surface provide connection to external parts.

As FIG. 1 illustrates, the terminals 102 of the first chip 101 are attached to the studs 122 of the top interposer surface 120a and the terminals 112 of the second chip 111 are attached to the studs 123 of the bottom interposer surface 120b. The preferred attachment technique is fusing, maybe supported by ultrasonic energy. This technique induces lower stress in the joint and in low-k dielectrics in the chips than conventional wire bonding. Any stress induced into the stud/terminal joint is significantly reduced by the low modulus compliant characteristic of the interposer material. Alternatively, solder attachment technique may be chosen for some devices.

The passive surface 111b of the second chip 111 adheres to the substrate using adhesive attach material 114. As a consequence, the active surface 111a of chip 111 together with the interposer 120 attached to surface 111a face away from the substrate.

As FIG. 1 further illustrates, the interposer forms, at the transition from the central area to the side wings, a convex curve or bending 150 downwardly along the height 113 of second chip 111. Thereafter, the interposer side wings form a concave curve or bending 151 to provide for the contact pads 130 a straight wing portion over the substrate 140.

The flexible characteristic of the interposer, especially when compliant materials are used, and the bending for the attachment to the substrate reduce the risk of package warpage in temperature excursions. The effect of the different coefficients of expansion of the semiconductors, metals and plastics employed in the device is greatly buffered or even decoupled by the compliant characteristic of the interposer.

Figure 6:
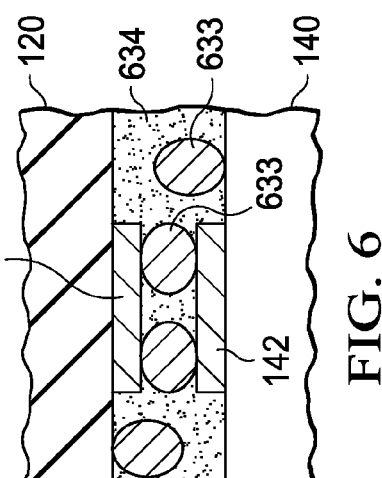
FIG. 6 shows a schematic cross section of an anisotropic conductive film joint connecting a conductor pad of the interposer dielectric material with a conductor pad of the substrate dielectric material.
Figure 5:
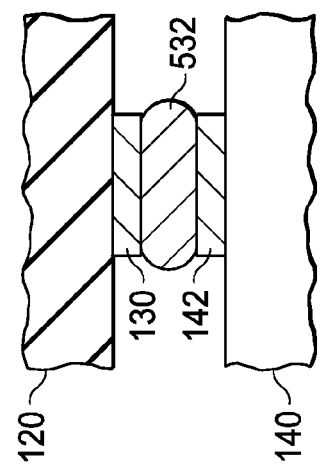
FIG. 5 shows a schematic cross section of a solder joint connecting a conductor pad of the interposer dielectric material with a conductor pad of the substrate dielectric material.
Figure 4:
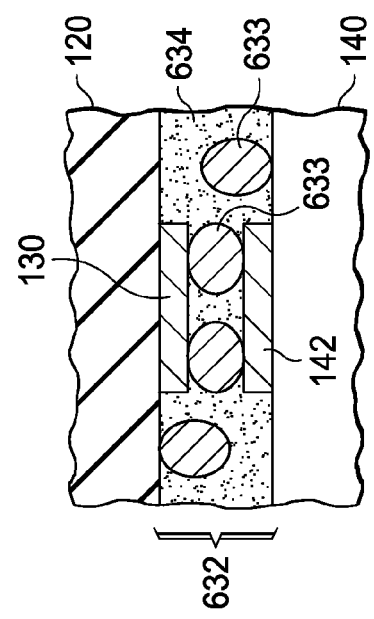
FIG. 4 shows a schematic cross section of a metal stud joint connecting a conductor pad of the interposer dielectric material with a conductor pad of the substrate dielectric material.

As depicted in FIG. 1, the contact pads 130, positioned in third locations on the side wings of interposer 120, are contacting matching attachment sites 142 of substrate 140 by metallic connectors, generally designated 131 in FIG. 1. FIGS. 4, 5 and 6 depict examples of several connector choices.

FIG. 4 shows a stud-shaped connector 432 made of a non-reflow metal such as gold, copper or an alloy thereof. To insure substantially equal height, the connectors may be studs created by plating or by a modified wire ball bonding and coining technique.

FIG. 5 illustrates a connector 532 made of a reflow alloy such as a tin-based solder.

FIG. 6 gives a simplified depiction of a connector 632, made of an anisotropic conductive film such as silver particles 633 suspended in a polymer matrix 634, to create electrical connection between pads 130 and sites 142.

It is an advantageous feature of the invention that the connectors of FIGS. 4, 5, and 6 can be miniaturized and do not require the need to adapt or invent a methodology to form a high aspect ratio (height/width) connection.

Attachment sites 143 may be used for pressure contacts to external parts; preferably, though, solder attachments 144 are used to connect to external parts 180, such as printed circuit boards and motherboards.

Another embodiment of the invention is a method for fabricating a semiconductor device with stacked chips and a substrate. The method starts by providing a first semiconductor chip with terminals in first locations, and a second semiconductor chip with a height and terminals in second locations. Alternatively, the first chip, or the second chip, or both chips may actually comprise a stack of chips.

A sheet-like insulating, compliant interposer is provided, integral with conductive traces, preferably made of a polyimide-type compound. The interposer has preferably a rectangular shape; the preferred thickness range of the interposer is between 25 and 50 µm. For many embodiments, the interposer has at least one slit; these slits extend from the corners of the rectangle diagonally inward. The ends of these slits define a boundary between a central area of the interposer and peripheral wings on the sides of the central area.

While some embodiments have only one wing, other embodiments have two or three wings. FIG. 2 illustrates an embodiment of an interposer with four wings.

The central area of the interposer has metal studs on the top and the bottom surface, which may be made of gold, copper, or solder. The studs on the top surface match the first terminal locations (of the first chip) and the studs on the bottom surface match the second terminal locations (of the second chip). In addition, the central area has conductive vias (for example, copper-filled), which extend from the top to the bottom surface. The pitch center-to-center of these vias is preferably less than 50 µm, and more preferably less than 25 µm.

The side wings of the interposer have on the bottom surface contact pads with metallic connectors; the pads are in third locations. The connectors may be made of gold studs, copper studs, solder balls, or anisotropic conductive films.

Next, the first chip is assembled on the central interposer area so that the chip terminals contact the studs on the top interposer surface, and the second chip is assembled on the central interposer area so that the chip terminals contact the studs on the bottom interposer surface. The assembly may be performed by a fusing technique including ultrasonic energy. The central interposer area remains flat during the attachments. Alternatively, reflow bodies such as solder balls may be used for the interconnection.

In the next process step, an insulating substrate is provided (for instance, made of fiber-enforced plastic), which has attachment sites in locations matching the third pad locations of the interposer side wings. The second chip is then attached to the substrate so that the interposer, onto which the chip has already been attached, faces away from the substrate.

Next, the interposer side wings are bent convex downwardly at an angle along the second chip height, until they are in close proximity to the substrate. They are then bent concave horizontally at an angle over and in parallel to the substrate. The contact pads of the interposer side wings are aligned with the matching substrate attachment sites. Finally, the side wing connectors are attached to the substrate sites. For many embodiments, solder balls are used as connectors (see FIG. 5); in this case, the temperature has to be elevated to reach the solder reflow temperature and establish the connection, before it is lowered again to ambient temperature. When a non-reflow metal such as gold is used for interconnection (see FIG. 4), a metal fusing technique, preferably with ultrasonic energy, is employed. For interconnection with anisotropic film, While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the interposer may be made of a relatively inflexible material; in this case, the interposer may be preformed in order to provide one plane for the attachment of the chips and another plane for the connection to the substrate, with the interposer also providing the coupling between the two planes.

As another example, the slits in the interposer may have the shape of relatively large-area triangles cut out form the flexible material in order to facilitate the convex and concave bendings of the interposer sheet.

It is therefore intended that the appended claims encompass any such modifications or embodiment.

What is claimed is:

1. A semiconductor apparatus comprising:
    a first semiconductor chip having terminals in first locations;
    a second semiconductor chip having a height, and terminals in second locations;
    an insulating flexible interposer, integral with conductive traces, having a top and a bottom surface, a central planar rectangular area, each side of the rectangle having a wing bent at an angle from the central plane;
    the central area having metal studs on the top and the bottom surface,
    the studs on the top surface matching the first terminal locations and the studs on the bottom surface matching the second terminal locations;
    the central area further having conductive vias extending from the top to the bottom surface;
    the side wings having contact pads with metallic connectors on the bottom surface in third locations;

the terminals of the first chip contacting the studs of the top interposer surface;

the terminals of the second chip contacting the studs of the bottom interposer surface;

an insulating substrate having attachment sites matching the third locations;

the second chip adhering to the substrate so that the attached interposer faces away from the substrate;

the interposer side wings having a convex bending downwardly along the second chip height and a concave bending over the substrate; and the connectors on the interposer side wings being attached to the matching substrate sites.

2. A semiconductor apparatus comprising:

an insulating interposer having a first surface, a second surface, four edges, and conductive traces on the first surface and second surface extending towards the four edges;

a first semiconductor chip affixed to a central area on the first surface and electrically connected to the conductive traces on the first surface;

a second semiconductor chip affixed to a central area on the second surface and electrically connected to the conductive traces on the second surface;

four gaps extending from intersections of the four edges towards the first semiconductor chip enabling four wing areas adjacent the four edges to bend away from second semiconductor chip; and a substrate metallurgically joined to the four bent wing areas.

3. The apparatus of claim 2 further comprising vias extending through the interposer, wherein the vias have a pitch center-to-center of about 50 pm or less.

4. The apparatus according to claim 2 wherein the interposer is made of a polyimide-based compound and has a thickness between about 25 and 50 pm.

5. The apparatus of claim 2 further comprising metal studs at the central area on the first surface and at the central area on the second surface, wherein the metal studs of the interposer central area are selected from a group including gold, copper, alloys thereof, solder, solder-clad gold, and solder-clad copper.

6. The apparatus of claim 2 wherein the metallic connectors the metallurgical joints of the side wings are selected from a group including solder balls, gold studs, copper studs, and anisotropic conductive films.

7. The apparatus of claim 2 wherein the first semiconductor chip is a stack of chips.

8. The apparatus of claim 2 wherein the second semiconductor chip is a stack of chips.

9. The apparatus of claim 2 further including discrete electronic components assembled on the interposer.

10. The apparatus of claim 2 further including thin-film structures built inside the interposer, the structures selected from a group including capacitors, inductors, antennas, and rf-shields.

11. The apparatus of claim 2 further including reflow bodies attached to the substrate for connection to external parts.

12. The semiconductor apparatus of claim 2, in which the first semiconductor chip is affixed on the substrate with an adhesive material.

\* \* \* \* \*